(12) United States Patent
Hsu et al.

(10) Patent No.: US 8,282,861 B2
(45) Date of Patent: Oct. 9, 2012

(54) ELECTRICALLY CONDUCTIVE POLYMER COMPOSITIONS

(76) Inventors: Che-Hsiung Hsu, Wilmington, DE (US); Ralph Birchard Lloyd, Fayetteville, NC (US); Adam Fennimore, Wilmington, DE (US); Michael Henry Howard, Jr., Montchanin, DE (US)

( * ) Notice: Subject to any disclaimer, the term of this patent is extended or adjusted under 35 U.S.C. 154(b) by 350 days.

(21) Appl. No.: 12/643,556

(22) Filed: Dec. 21, 2009

(65) Prior Publication Data

US 2011/0147719 A1 Jun. 23, 2011

(51) Int. Cl.
- *H01B 1/00* (2006.01)
- *H01L 29/08* (2006.01)
- *C08G 75/00* (2006.01)
- *C08G 73/00* (2006.01)
- *C08G 73/06* (2006.01)

(52) U.S. Cl. .......... 252/500; 257/40; 528/377; 528/422; 528/423

(58) Field of Classification Search ....... 252/500–521.6; 257/40; 528/377, 422, 423
See application file for complete search history.

(56) References Cited

U.S. PATENT DOCUMENTS

| | | | |
|---|---|---|---|
| 3,282,875 A | 11/1966 | Connolly et al. | |
| 3,849,458 A | 11/1974 | Dinh | |
| 4,358,545 A | 11/1982 | Ezzell et al. | |
| 4,940,525 A | 7/1990 | Ezzell | |
| 5,254,633 A * | 10/1993 | Han et al. | 525/327.4 |
| 5,911,918 A | 6/1999 | Shacklette et al. | |
| 6,150,426 A | 11/2000 | Curtin et al. | |
| 6,670,645 B2 | 12/2003 | Grushin et al. | |
| 6,686,067 B2 | 2/2004 | Li | |
| 7,211,202 B2 | 5/2007 | Korzhenko | |
| 7,351,358 B2 | 4/2008 | Hsu et al. | |
| 7,390,438 B2 | 6/2008 | Hsu et al. | |
| 7,462,298 B2 | 12/2008 | Hsu et al. | |
| 7,722,785 B2 | 5/2010 | Hsu et al. | |
| 8,026,665 B2 | 9/2011 | Kim et al. | |
| 2002/0076576 A1* | 6/2002 | Li et al. | 428/690 |
| 2003/0227001 A1* | 12/2003 | Li et al. | 252/301.35 |
| 2004/0102577 A1 | 5/2004 | Hsu et al. | |
| 2004/0127637 A1 | 7/2004 | Hsu et al. | |
| 2005/0035335 A1* | 2/2005 | Han et al. | 252/500 |
| 2005/0184287 A1 | 8/2005 | Herron et al. | |
| 2005/0205860 A1 | 9/2005 | Hsu et al. | |
| 2006/0076557 A1 | 4/2006 | Waller et al. | |
| 2007/0066755 A1 | 3/2007 | Hsu et al. | |
| 2007/0215864 A1* | 9/2007 | Luebben et al. | 257/40 |
| 2008/0191614 A1 | 8/2008 | Kim et al. | |
| 2008/0286605 A1 | 11/2008 | Takeda | |

FOREIGN PATENT DOCUMENTS

WO 03008424 A1 1/2003

(Continued)

OTHER PUBLICATIONS

Constantini, N. et al., "Infrared spectroscopic study of polaron formation in electrochemicallly synthesised poly(3-alklypyrroles)", 5, pp. 749-757 (2003).*

(Continued)

*Primary Examiner* — Mark Kopec
*Assistant Examiner* — Jaison Thomas

(57) ABSTRACT

The present invention relates to electrically conductive compositions, and their use in electronic devices. The composition includes either (1) a deuterated electrically conductive polymer doped with a highly-fluorinated acid polymer; or (2) (a) a deuterated electrically conductive polymer doped with a non-fluorinated polymeric acid and (b) at least one highly-fluorinated acid polymer.

19 Claims, 3 Drawing Sheets

FOREIGN PATENT DOCUMENTS

| WO | 03063555 | A1 | 7/2003 |
| WO | 03091688 | A2 | 11/2003 |
| WO | 2004016710 | A1 | 2/2004 |
| WO | 2005052027 | A1 | 6/2005 |

OTHER PUBLICATIONS

International Search Report, PCT/US2010/061680, Dated Sep. 29, 2011.

Appleby et al., Polymeric Perfluoro Bis-Sulfanomides as Possible Fuel Cell Electrolytes, J. Electrochem. Soc., 1993, vol. 140, pp. 109-111.

Desmarteau et al., "Novel Perfluorinated Ionomers and Ionenes," J. Fluorine Chem., 1995, vol. 72, pp. 203-208.

Feiring et al., "Aromatic Monomers with Pendant Fluoroalkylsolfonate and Sulfonimide Groups," Journal of Fluorine Chemistry, 2000, vol. 105, pp. 129-135.

Feiring et al., "Novel Aromatic Polymers with Pendant Lithium Perfluoroalkylsulfonate or Sulfinimide Groups," Macromolecules, 2000, vol. 33, pp. 9262-9271.

Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.

* cited by examiner

ELECTRICALLY CONDUCTIVE POLYMER COMPOSITIONS

BACKGROUND INFORMATION

1. Field of the Disclosure

This disclosure relates in general to compositions comprising electrically conductive polymers and their use in electronic devices.

2. Description of the Related Art

Electronic devices define a category of products that include an active layer. Organic electronic devices have at least one organic active layer. Such devices convert electrical energy into radiation such as light emitting diodes, detect signals through electronic processes, convert radiation into electrical energy, such as photovoltaic cells, or include one or more organic semiconductor layers.

Organic light-emitting diodes (OLEDs) are an organic electronic device comprising an organic layer capable of electroluminescence. OLEDs containing conducting polymers can have the following configuration:

anode/buffer layer/EL material/cathode with additional layers between the electrodes. The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. Electrically conductive polymers having low conductivity in the range of $10^{-3}$ to $10^{-7}$ S/cm are commonly used as the buffer layer in direct contact with an electrically conductive anode, such as ITO.

There is a continuing need for improved materials for electronic devices.

SUMMARY

There is provided a composition comprising either (1) or (2) below:
(1) a deuterated electrically conductive polymer doped with a highly-fluorinated acid polymer; or
(2) (a) a deuterated electrically conductive polymer doped with a non-fluorinated polymeric acid; and
    (b) at least one highly-fluorinated acid polymer.

There is also provided a liquid composition comprising (1) or (2) below:
(1) (a) at least one deuterated electrically conductive polymer doped with at least one highly-fluorinated acid polymer; and
    (b) a deuterated liquid medium; or
(2) (a) at least one deuterated electrically conductive polymer doped with a non-fluorinated polymeric acid;
    (b) at least one highly-fluorinated acid polymer; and
    (c) a deuterated liquid medium.

There is also provided an electronic device having at least one active layer comprising the above composition.

BRIEF DESCRIPTION OF THE DRAWINGS

The invention is illustrated by way of example and not limitation in the accompanying figures.

Figure 1A:
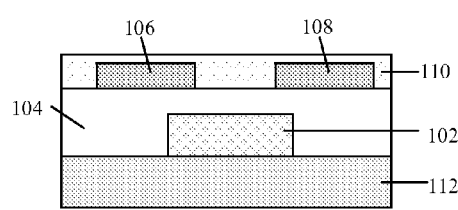
FIG. 1A includes a schematic diagram of an organic field effect transistor (OTFT) showing the relative positions of the active layers of such a device in bottom contact mode.

Skilled artisans will appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Deuterated Electrically Conductive Polymer, the Highly-Fluorinated Acid Polymer, the Electrically Conductive Composition, Electronic Devices, and finally, Examples.

1. Definitions and Clarification of Terms

Before addressing details of embodiments described below, some terms are defined or clarified.

The term "acid polymer" refers to a polymer having acidic groups.

The term "acidic group" refers to a group capable of ionizing to donate a hydrogen ion to a Brønsted base.

The term "conductor" and its variants are intended to refer to a layer material, member, or structure having an electrical property such that current flows through such layer material, member, or structure without a substantial drop in potential. The term is intended to include semiconductors. In some embodiments, a conductor will form a layer having a conductivity of at least $10^{-7}$ S/cm.

The term "deuterated" is intended to mean that at least one hydrogen has been replaced by deuterium. The deuterium is present in at least 100 times the natural abundance level. A "deuterated analog" of compound X has the same structure as compound X, but with at least one D replacing H. A material which is Y % deuterated, has Y % of hydrogens replaced with deuteriums.

The term "doped" as it refers to an electrically conductive polymer, is intended to mean that the electrically conductive polymer has a polymeric counterion to balance the charge on the polymer.

The term "doped electrically conductive polymer" is intended to mean the electrically conductive polymer and the polymeric counterion that is associated with it.

The term "electrically conductive" as it refers to a material, is intended to mean a material which is inherently or intrinsically capable of electrical conductivity without the addition of carbon black or conductive metal particles.

The term "electroactive" when referring to a layer or material, is intended to mean a layer or material that exhibits electronic or electroradiative properties. In an electronic device, an electroactive material electronically facilitates the operation of the device. Examples of electroactive materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "electron transport" when referring to a layer, material, member or structure, is intended to mean that such a layer, material, member or structure that promotes or facilitates migration of negative charges through such a layer, material, member or structure into another layer, material, member or structure.

The terms "fully-fluorinated" and "perfluorinated" are used interchangeably and refer to a compound where all of the available hydrogens bonded to carbon have been replaced by fluorine.

The term "highly-fluorinated" refers to a compound in which at least 90% of the available hydrogens bonded to carbon have been replaced by fluorine.

The term "hole injection layer" or "hole injection material" is intended to refer to electrically conductive or semiconductive layers or materials which may have one or more functions in an organic electronic device, including but not limited to, planarization of the underlying layer, charge transport and/or charge injection properties, scavenging of impurities such as oxygen or metal ions, and other aspects to facilitate or to improve the performance of an organic electronic device.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "layer" is used interchangeably with the term "film" and refers to a coating covering a desired area. The term is not limited by size. The area can be as large as an entire device or as small as a specific functional area such as the actual visual display, or as small as a single sub-pixel. Unless otherwise indicated, layers and films can be formed by any conventional deposition technique, including vapor deposition, liquid deposition (continuous and discontinuous techniques), and thermal transfer.

The term "organic electronic device" is intended to mean a device including one or more organic layers or materials.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

Although light-emitting materials may also have some charge transport properties, the terms "hole transport" and "electron transport" are not intended to include a layer, material, member, or structure whose primary function is light emission.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* $81^{st}$ Edition (2000-2001).

Unless otherwise defined, all technical and scientific terms used herein have the same meaning as commonly understood by one of ordinary skill in the art to which this invention belongs. In the Formulae, the letters Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics,* $81^{st}$ Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. Deuterated Electrically Conductive Polymer

The deuterated electrically conductive polymer has at least one D. By "deuterated electrically conductive polymer" it is meant that the electrically conductive polymer itself, not including the associated polymeric acid, is deuterated. In some embodiments, the electrically conductive polymer is at least 10% deuterated. By this is meant that at least 10% of the H are replaced by D. In some embodiments, the polymer is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the electrically conductive polymer is 100% deuterated.

Any deuterated electrically conductive polymer can be used in the new composition. In some embodiments, the deuterated electrically conductive polymer will form a film which has a conductivity greater than $10^{-7}$ S/cm.

The deuterated electrically conductive polymers suitable for the new composition are made from at least one monomer which, when polymerized alone, forms an electrically conductive homopolymer. Such monomers are referred to herein as "conductive precursor monomers." Monomers which, when polymerized alone form homopolymers which are not electrically conductive, are referred to as "non-conductive precursor monomers." The deuterated electrically conductive polymer can be a homopolymer or a copolymer. Deuterated electrically conductive copolymers suitable for the new composition can be made from two or more conductive precursor monomers or from a combination of one or more conductive precursor monomers and one or more non-conductive precursor monomers.

The deuterated electrically conductive polymer can be made from deuterated conductive precursor monomers. Alternatively, the deuterated electrically conductive polymer can be made from non-deuterated conductive precursor monomers and then deuterated after polymerization.

In some embodiments, the deuterated electrically conductive polymer is made from at least one precursor monomer selected from thiophenes, selenophenes, tellurophenes, pyrroles, anilines, 4-amino-indoles, 7-amino-indoles, polycyclic aromatics, and deuterated analogs thereof. The polymers made from these monomers are referred to herein as polythiophenes, poly(selenophenes), poly(tellurophenes), polypyrroles, polyanilines, poly(4-amino-indoles), poly(7-amino-indoles), and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly(thienothiophenes).

In some embodiments, monomers contemplated for use to form the deuterated electrically conductive polymer comprise Formula I below:

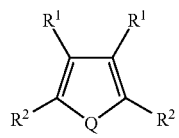

(I)

wherein:
Q is selected from the group consisting of S, Se, and Te;
$R^1$ is independently selected so as to be the same or different at each occurrence and is selected from hydrogen, deuterium, alkyl, alkenyl, alkoxy, alkanoyl, alkylhio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms; and
$R^2$ is H or D.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:
"alcohol"-$R^3$—OH
"amido"-$R^3$—C(O)N($R^6$) $R^6$
"amidosulfonate"-$R^3$—C(O)N($R^6$) $R^4$—$SO_3Z$
"benzyl"-$CH_2$—$C_6H_5$
"carboxylate"-$R^3$—C(O)O—Z or —$R^3$—O—C(O)—Z
"ether"-$R^3$—(O—$R^5$)$_p$—O—$R^5$
"ether carboxylate"-$R^3$—O—$R^4$—C(O)O—Z or —$R^3$—O—$R^4$—O—C(O)—Z
"ether sulfonate"-$R^3$—O—$R^4$—$SO_3Z$
"ester sulfonate"-$R^3$—O—C(O)—$R^4$—$SO_3Z$
"sulfonimide"-$R^3$—$SO_2$—NH—$SO_2$—$R^6$
"urethane"-$R^3$—O—C(O)—N($R^6$)$_2$
where all "R" groups are the same or different at each occurrence and:
$R^3$ is a single bond or an alkylene group
$R^4$ is an alkylene group
$R^5$ is an alkyl group
$R^6$ is hydrogen, deuterium or an alkyl group
p is 0 or an integer from 1 to 20
Z is H, D, alkali metal, alkaline earth metal, N($R^5$)$_4$ or $R^5$ In any of the above groups, one or more H may be replaced by D. Any of the above groups may further be unsubstituted or substituted, and any group may have F substituted for one or more hydrogens, including perfluorinated groups. In some embodiments, the alkyl and alkylene groups have from 1-20 carbon atoms. In some embodiments, the alkyl and alkylene groups are deuterated.

In some embodiments, in the monomer, both $R^1$ together form —W—$(CY^1Y^2)_m$—W—, where m is 2 or 3, W is O, S, Se, PO, N$R^6$, $Y^1$ is the same or different at each occurrence and is hydrogen, deuterium or fluorine, and $Y^2$ is the same or different at each occurrence and is selected from hydrogen, deuterium, halogen, alkyl, alcohol, amidosulfonate, benzyl, carboxylate, ether, ether carboxylate, ether sulfonate, ester sulfonate, and urethane, where the Y groups may be partially or fully deuterated or partially or fully fluorinated. In some embodiments, all Y are hydrogen or deuterium.

In some embodiments, the conductive precursor monomer is 3,4-ethylenedioxythiophene ("EDOT"). In some embodiments, the conductive precursor monomer is $D_4$-EDOT or $D_6$-EDOT, shown below.

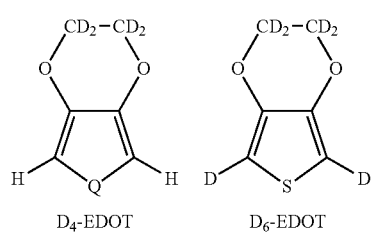

The polymers made from these materials are abbreviated as poly($D_4$-EDOT) and poly($D_6$-EDOT), respectively.

In some embodiments, the monomer has Formula I(a):

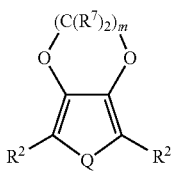
(Ia)

wherein:
Q is selected from the group consisting of S, Se, and Te;
$R^2$ is H or D;
$R^7$ is the same or different at each occurrence and is selected from hydrogen, deuterium, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

In some embodiments of Formula I(a), m is two, one $R^7$ is an alkyl group of more than 5 carbon atoms, and all other $R^7$ are hydrogen or deuterium. In some embodiments of Formula I(a), at least one $R^7$ group is fluorinated. In some embodiments, at least one $R^7$ group has at least one fluorine substituent. In some embodiments, the $R^7$ group is fully fluorinated.

In some embodiments of Formula I(a), the $R^7$ substituents on the fused alicyclic ring on the monomer offer improved solubility of the monomers in water and facilitate polymerization in the presence of the fluorinated acid polymer.

In some embodiments of Formula I(a), m is 2, one $R^7$ is sulfonic acid-propylene-ether-methylene and all other $R^7$ are hydrogen or deuterium. In some embodiments, m is 2, one $R^7$ is propyl-ether-ethylene and all other $R^7$ are hydrogen or deuterium. In some embodiments, m is 2, one $R^7$ is methoxy and all other $R^7$ are hydrogen or deuterium. In some embodiments, one $R^7$ is sulfonic acid difluoromethylene ester methylene ($-CH_2-O-C(O)-CF_2-/SO_3H$), and all other $R^7$ are hydrogen or deuterium.

In some embodiments, pyrrole monomers contemplated for use to form the electrically conductive polymer in the new composite dispersion comprise Formula II below.

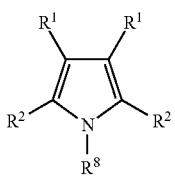
(II)

where in Formula II:
$R^1$ is independently selected so as to be the same or different at each occurrence and is selected from the group consisting of hydrogen, deuterium, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, urethane, and deuterated analogs thereof; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms;
$R^2$ is independently selected so as to be the same or different at each occurrence and is selected from the group consisting of hydrogen and deuterium; and
$R^8$ is independently selected so as to be the same or different at each occurrence and is selected from hydrogen, deuterium, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, urethane, and deuterated analogs thereof.

In some embodiments, $R^1$ is the same or different at each occurrence and is independently selected from hydrogen, deuterium, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties. Any of the above groups may be deuterated.

In some embodiments, $R^8$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and $R^1$, $R^2$, and $R^8$ are hydrogen. Unsubstituted non-deuterated pyrrole is abbreviated herein as "Py". In some embodiments, $R^1$, $R^2$, and $R^8$ are deuterium. The fully deuterated pyrrole monomer is abbreviated as "$D_5$-Py". The polymer made from this monomer is abbreviated as "poly($D_5$-Py)".

In some embodiments of Formula II, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, urethane, and deuterated analogs thereof. These groups can improve the solubility of the monomer and the resulting polymer. In some embodiments, both $R^1$ together form a 6- or 7-membered alicyclic ring, which is further substituted with an alkyl group. In some embodiments, both $R^1$ together form a 6- or 7-membered alicyclic ring, which is further substituted with an alkyl group having at least 1 carbon atom.

In some embodiments, both $R^1$ together form $-O-(CY_2)_1-O-$, where m is 2 or 3, and Y is the same or different at each occurrence and is selected from hydrogen, deuterium, alkyl, alcohol, benzyl, carboxylate, amidosulfonate, ether, ether carboxylate, ether sulfonate, ester sulfonate, urethane, and deuterated analogs thereof. In some embodiments, at least one Y group is deuterium. In some embodiments, at least one Y group is a substituent having F substituted for at least one hydrogen. In some embodiments, at least one Y group is perfluorinated.

In some embodiments, aniline monomers contemplated for use to form the electrically conductive polymer in the new composite dispersion comprise Formula III below.

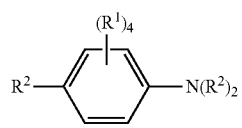
(III)

wherein:
$R^1$ is independently selected so as to be the same or different at each occurrence and is selected from the group consisting of hydrogen, deuterium, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, urethane, and deuterated analogs thereof; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from the group consisting of hydrogen and deuterium.

When polymerized, the aniline monomeric unit can have Formula IV(a) or Formula IV(b) shown below, or a combination of both formulae.

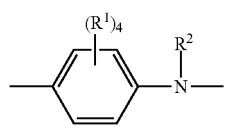

(IV(a))

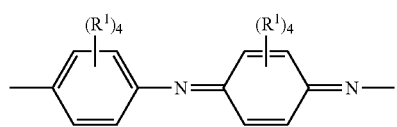

(IV(b))

where $R^1$ and $R^2$ are as defined above.

In some embodiments of Formula III, the aniline monomer is unsubstituted and $R^1$ and $R^2$ are H or D. The non-deuterated unsubstituted aniline monomer is abbreviated herein as "ani". In some embodiments, the monomer is $D_5$-ani or $D_7$-ani, as shown below.

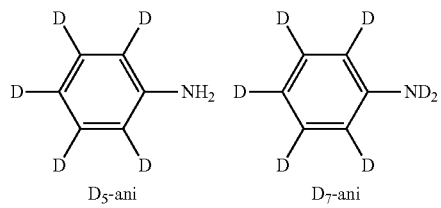

The polymers made from these monomers are abbreviated as poly($D_5$-ani) and poly($D_7$-ani), respectively.

In some embodiments of Formula III, at least one $R^1$ is fluorinated. In some embodiments, at least one $R^1$ is perfluorinated.

In some embodiments, fused polycylic heteroaromatic monomers contemplated for use to form the deuterated electrically conductive polymer in the new composite dispersion have two or more fused aromatic rings, at least one of which is heteroaromatic. In some embodiments, the fused polycyclic heteroaromatic monomer has Formula V:

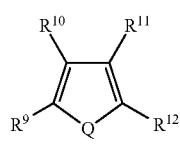

(V)

wherein:

Q is S, Se, Te, or $NR^6$;

$R^6$ is hydrogen, deuterium or alkyl;

$R^9, R^{10}, R^{11}$, and $R^{12}$ are independently selected so as to be the same or different at each occurrence and are selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^9$ and $R^{10}$, $R^{10}$ and $R^{11}$, and $R^{11}$ and $R^{12}$ together form an alkenylene chain completing a 5 or 6-membered aromatic ring, which ring may optionally include one or more divalent nitrogen, sulfur, selenium, tellurium, or oxygen atoms.

In some embodiments, the fused polycyclic heteroaromatic monomer has a formula selected from the group consisting of Formula V(a), V(b), V(c), V(d), V(e), V(f), V(g), V(h), V(i), V(j), and V(k):

(Va)

(Vb)

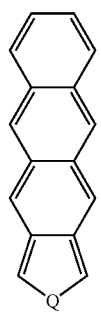

(Vc)

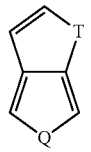

(Vd)

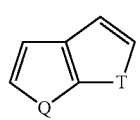

(Ve)

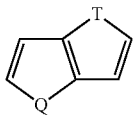 (Vf)

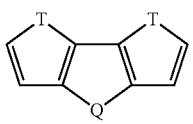 (Vg)

 (Vh)

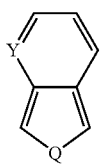 (Vi)

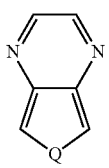 (Vj)

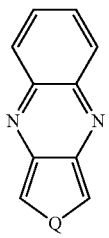 (Vk)

wherein:
Q is S, Se, Te, NH, or ND; and
T is the same or different at each occurrence and is selected from S, NR$^6$, O, SiR$^6{}_2$, Se, Te, and PR$^6$;
Y is N;
R$^6$ is H, D, or alkyl; and
there is at least one deuterium.

The fused polycyclic heteroaromatic monomers may be further substituted with groups selected from alkyl, heteroalkyl, alcohol, benzyl, carboxylate, ether, ether carboxylate, ether sulfonate, ester sulfonate, urethane, and deuterated analogs thereof. In some embodiments, the substituent groups fully deuterated. In some embodiments, the substituent groups are fluorinated. In some embodiments, the substituent groups are fully fluorinated.

In some embodiments, the fused polycyclic heteroaromatic monomer is a deuterated thieno(thiophene). The nondeuterated analogs of such compounds have been discussed in, for example, Macromolecules, 34, 5746-5747 (2001); and Macromolecules, 35, 7281-7286 (2002). In some embodiments, the thieno(thiophene) is selected from thieno(2,3-b)thiophene, thieno(3,2-b)thiophene, and thieno(3,4-b)thiophene, each of which can have 1-4 deuterium atoms. In some embodiments, the thieno(thiophene)monomer is further substituted with at least one group selected from alkyl, heteroalkyl, alcohol, benzyl, carboxylate, ether, ether carboxylate, ether sulfonate, ester sulfonate, urethane, and deuterated analogs thereof. In some embodiments, the substituent groups are fully deuterated. In some embodiments, the substituents groups are fluorinated. In some embodiments, the substituent groups are fully fluorinated.

In some embodiments, polycyclic heteroaromatic monomers contemplated for use to form the polymer in the new composite dispersion comprise Formula VI:

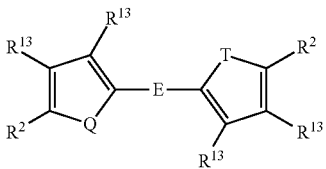 (VI)

wherein:
Q is S, Se, Te, or NR$^6$;
T is selected from S, NR$^6$, O, SiR$^6{}_2$, Se, Te, and PR$^6$;
E is selected from alkenylene, arylene, and heteroarylene;
R$^2$ is hydrogen or deuterium;
R$^6$ is hydrogen, deuterium or alkyl;
R$^{13}$ is the same or different at each occurrence and is selected from hydrogen, deuterium, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, urethane, and deuterated analogs thereof; or both R$^{13}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In some embodiments, the electrically conductive polymer is a copolymer of a precursor monomer and at least one second monomer. Any type of second monomer can be used, so long as it does not detrimentally affect the desired properties of the copolymer. In some embodiments, the second monomer comprises no more than 50% of the polymer, based on the total number of monomer units. In some embodiments, the second monomer comprises no more than 30%, based on the total number of monomer units. In some embodiments, the second monomer comprises no more than 10%, based on the total number of monomer units.

Exemplary types of second monomers include, but are not limited to, alkenyl, alkynyl, arylene, heteroarylene, and deuterated analogs thereof. Examples of second monomers include, but are not limited to, fluorene, oxadiazole, thiadiazole, benzothiadiazole, phenylenevinylene, phenyleneethynylene, pyridine, diazines, triazines, and deuterated analogs thereof, all of which may be further substituted.

In some embodiments, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In some embodiments, the electrically conductive polymer is selected from the group consisting of a deuterated polythiophene, a deuterated polyaniline, a deuterated polypyrrole, a deuterated polymeric fused polycyclic heteroaromatic, a deuterated poly(aminoindole), a copolymer thereof, and combinations thereof.

In some embodiments, the electrically conductive polymer is selected from the group consisting of poly($D_6$-EDOT), poly($D_5$-Py), poly($D_7$-ani), poly(perdeutero-4-aminoindole), poly(perdeutero-7-aminoindole), poly(perdeutero-thieno(2,3-b)thiophene), poly(perdeutero-thieno(3,2-b)thiophene), and poly(perdeutero-thieno(3,4-b)thiophene).

3. Highly-Fluorinated Acid Polymer

The highly-fluorinated acid polymer ("HFAP") can be any polymer which is highly-fluorinated and has acidic groups. The acidic groups supply an ionizable proton, $H^+$, or deuteron, $D^+$. In some embodiments, the acidic group has a pKa of less than 3. In some embodiments, the acidic group has a pKa of less than 0. In some embodiments, the acidic group has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonimide groups, and combinations thereof.

In some embodiments, the HFAP is a deutero-acid with an acidic deuteron.

In some embodiments, the HFAP is at least 95% fluorinated; in some embodiments, fully-fluorinated. In some embodiments, when the HFAP is not fully-fluorinated, the non-fluorinated sites are deuterated so that there are no hydrogens. In some embodiments, the HFAP is fully fluorinated and is a deutero-acid with an acidic deuteron.

In some embodiments, the HFAP is water-soluble. In some embodiments, the HFAP is dispersible in water. In some embodiments, the HFAP is organic solvent wettable. The term "organic solvent wettable" refers to a material which, when formed into a film, possesses a contact angle no greater than 60° C. with organic solvents. In some embodiments, wettable materials form films which are wettable by phenylhexane with a contact angle no greater than 55°. The methods for measuring contact angles are well known. In some embodiments, the wettable material can be made from a polymeric acid that, by itself is non-wettable, but with selective additives it can be made wettable.

Examples of suitable polymeric backbones include, but are not limited to, polyolefins, polyacrylates, polymethacrylates, polyimides, polyamides, polyaramids, polyacrylamides, polystyrenes, copolymers thereof, and deuterated analogs thereof, all of which are highly-fluorinated; in some embodiments, fully-fluorinated.

In one embodiment, the acidic groups are sulfonic acid groups or sulfonimide groups. A sulfonimide group has the formula:

—SO$_2$—NH—SO$_2$—R where R is an alkyl group. A deutero-sulfonimide group has the formula:

—SO$_2$—ND—SO$_2$—R where R is an alkyl group.

In one embodiment, the acidic groups are on a fluorinated side chain. In one embodiment, the fluorinated side chains are selected from alkyl groups, alkoxy groups, amido groups, ether groups, and combinations thereof, all of which are fully fluorinated.

In one embodiment, the HFAP has a highly-fluorinated olefin backbone, with pendant highly-fluorinated alkyl sulfonate, highly-fluorinated ether sulfonate, highly-fluorinated ester sulfonate, or highly-fluorinated ether sulfonimide groups. In one embodiment, the HFAP is a perfluoroolefin having perfluoro-ether-sulfonic acid side chains. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the HFAP is homopolymer or copolymer of a fluorinated and partially sulfonated poly(arylene ether sulfone). The copolymer can be a block copolymer.

In one embodiment, the HFAP is a sulfonimide polymer having Formula IX:

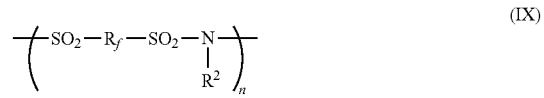

(IX)

where:

$R^2$ is H or D;

$R_f$ is selected from highly-fluorinated alkylene, highly-fluorinated heteroalkylene, highly-fluorinated arylene, and highly-fluorinated heteroarylene, which may be substituted with one or more ether oxygens; and n is at least 4.

In one embodiment of Formula IX, $R_f$ is a perfluoroalkyl group. In one embodiment, $R_f$ is a perfluorobutyl group. In one embodiment, $R_f$ contains ether oxygens. In one embodiment n is greater than 10.

In one embodiment, the HFAP comprises a highly-fluorinated polymer backbone and a side chain having Formula X:

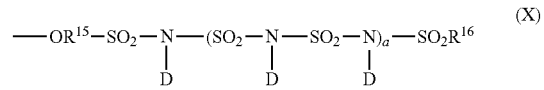

(X)

where:

$R^{15}$ is a highly-fluorinated alkylene group or a highly-fluorinated heteroalkylene group;

$R^{16}$ is a highly-fluorinated alkyl or a highly-fluorinated aryl group; and a is 0 or an integer from 1 to 4.

In one embodiment, the HFAP has Formula XI:

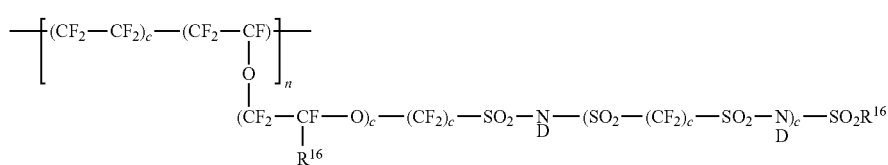

where:
R$^{16}$ is a highly-fluorinated alkyl or a highly-fluorinated aryl group;
c is independently 0 or an integer from 1 to 3; and
n is at least 4.

The synthesis of non-deuterated analogs of the HFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the HFAP also comprises a repeat unit derived from at least one highly-fluorinated ethylenically unsaturated compound. The perfluoroolefin comprises 2 to 20 carbon atoms. Representative perfluoroolefins include, but are not limited to, tetrafluoroethylene, hexafluoropropylene, perfluoro-(2,2-dimethyl-1,3-dioxole), perfluoro-(2-methylene-4-methyl-1,3-dioxolane), $CF_2$=$CFO(CF_2)_tCF$=$CF_2$, where t is 1 or 2, and R$_f$"OCF=CF$_2$ wherein R$_f$" is a saturated perfluoroalkyl group of from 1 to about ten carbon atoms. In one embodiment, the comonomer is tetrafluoroethylene.

In one embodiment, the HFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any highly-fluorinated colloid-forming polymeric material having acidic protons can be used.

Some of the polymers described hereinabove may be formed in non-acid form, e.g., as salts, esters, or sulfonyl fluorides. They will be converted to the acid form for the preparation of conductive compositions, described below.

In some embodiments, HFAP include a highly-fluorinated carbon backbone and side chains represented by the formula

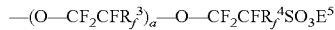

wherein R$_f^3$ and R$_f^4$ are independently selected from F, Cl or a highly-fluorinated alkyl group having 1 to 10 carbon atoms, a=0, 1 or 2, and E$^5$. In some cases E$^5$ can be a cation such as Li, Na, or K, and be converted to the acid form.

In some embodiments, the HFAP can be the polymers disclosed in U.S. Pat. No. 3,282,875 and in U.S. Pat. Nos. 4,358,545 and 4,940,525. In some embodiments, the HFAP comprises a perfluorocarbon backbone and the side chain represented by the formula

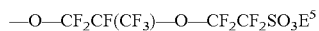

where E$^5$ is as defined above. HFAPs of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3E^5$, wherein E$^5$ is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

One type of HFAP is available commercially as aqueous Nafion® dispersions, from E.I. du Pont de Nemours and Company (Wilmington, Del.).

The deutero-acid can be made from the protonic HFAP by isolating the solid acid material and treating in D$_2$O at an elevated temperature and pressure. In some embodiments, the solid HFAP is heated in D$_2$O to a temperature between 100 and 300° C. in a closed, pressure vessel.

4. Electrically Conductive Composition

The new electrically conductive composition comprises:
(1) a composition comprising a deuterated electrically conductive polymer doped with a highly-fluorinated acid polymer; or
(2) a composition comprising:
  (a) a deuterated electrically conductive polymer doped with a non-fluorinated polymeric acid; and
  (b) at least one highly-fluorinated acid polymer.

In some embodiments, an electrically conductive composition comprises (a) a deuterated electrically conductive polymer doped with a non-fluorinated polymeric acid and (b) a highly-fluorinated acid polymer. In some embodiments, an electrically conductive composition consists essentially of (a) a deuterated electrically conductive polymer doped with a non-fluorinated polymeric acid and (b) a highly-fluorinated acid polymer.

In some embodiments, an electrically conductive composition comprises a deuterated electrically conductive polymer doped with a highly-fluorinated acid polymer. In some embodiments, an electrically conductive composition consists essentially of a deuterated electrically conductive polymer doped with a highly-fluorinated acid polymer.

In some embodiments, an electrically conductive composition comprises:
(1) a liquid composition comprising
  (a) at least one deuterated electrically conductive polymer doped with at least one highly-fluorinated acid polymer; and
  (b) a deuterated liquid medium; or (2) a liquid composition comprising
  (a) at least one deuterated electrically conductive polymer doped with a non-fluorinated polymeric acid;
  (b) at least one highly-fluorinated acid polymer; and
  (c) a deuterated liquid medium.

In some embodiments, an electrically conductive composition comprises a deuterated liquid medium having dispersed therein (a) a deuterated electrically conductive polymer doped with a non-fluorinated polymeric acid and (b) a highly-fluorinated acid polymer. In some embodiments, an electrically conductive composition comprises $D_2O$ having dispersed therein (a) a deuterated electrically conductive polymer doped with a non-fluorinated polymeric acid and (b) a highly-fluorinated acid polymer. In some embodiments, an electrically conductive composition consists essentially of a deuterated liquid medium having dispersed therein (a) a deuterated electrically conductive polymer doped with a non-fluorinated polymeric acid and (b) a highly-fluorinated acid polymer. In some embodiments, an electrically conductive composition consists essentially of $D_2O$ having dispersed therein (a) a deuterated electrically conductive polymer doped with a non-fluorinated polymeric acid and (b) a highly-fluorinated acid polymer.

In some embodiments, an electrically conductive composition comprises a deuterated liquid medium having dispersed therein a deuterated electrically conductive polymer doped with a highly-fluorinated acid polymer. In some embodiments, an electrically conductive composition comprises $D_2O$ having dispersed therein a deuterated electrically conductive polymer doped with a highly-fluorinated acid polymer. In some embodiments, the electrically conductive composition consists essentially of a deuterated liquid medium having dispersed therein a deuterated conductive polymer doped with a highly-fluorinated acid polymer. In some embodiments, the electrically conductive composition consists essentially of $D_2O$ having dispersed therein (a) a deuterated conductive polymer doped with a highly-fluorinated acid polymer.

In some embodiments, optional additives are present in the composition. Examples of types of materials which can be added include, but are not limited to polymers, dyes, coating aids, organic and inorganic conductive inks and pastes, charge transport materials, crosslinking agents, and combinations thereof. The additives should be materials that are soluble or dispersible in the deuterated liquid medium and can be simple molecules or polymers.

a. Deuterated Electrically Conductive Polymer Doped with Non-Fluorinated Polymeric Acid Any non-fluorinated polymeric acid, which is capable of doping the electrically conductive polymer, can be used to make the new composite dispersions. In some embodiments, the non-fluorinated polymeric acid is less than 10% fluorinated; in some embodiments, less than 1% fluorinated. In some embodiments, the non-fluorinated polymeric acid has no fluorines. In some embodiments, the non-fluorinated polymeric acid is a deutero-acid. In some embodiments, the non-fluoroinated polymeric deutero-acid is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated. In some embodiments, the non-fluoroinated polymeric acid is 100% deuterated.

Examples of acidic groups include, but are not limited to, carboxylic acid groups, sulfonic acid groups, sulfonimide groups, phosphoric acid groups, phosphonic acid groups, deuterated analogs thereof, and combinations thereof. The acidic groups can all be the same, or the polymer may have more than one type of acidic group.

In one embodiment, the acid is a non-fluorinated polymeric sulfonic acid. Some non-limiting examples of the acids are poly(styrenesulfonic acid) ("PSSA"), poly(perdeutero-styrenesulfonic acid) ("$D_8$-PSSA"), poly(2-acrylamido-2-methyl-1-propanesulfonic acid) ("PAAMPSA"), poly(perdeutero-2-acrylamido-2-methyl-1-propanesulfonic acid) ("$D_{13}$-PAAMPSA"), and mixtures thereof.

The amount of non-fluorinated polymeric acid present is generally in excess of that required to counterbalance the charge on the conducting polymer. In some embodiments, the ratio of acid equivalents of non-fluorinated polymeric acid to molar equivalents of conducting polymer is in the range of 1-5.

The doped electrically conductive polymer can be formed by oxidative polymerization of the precursor monomer in the presence of the non-fluorinated polymeric acid in $D_2O$. Oxidative polymerization of such monomers is well known. Oxidants such as sodium or potassium persulfate may be used. In some cases a catalyst, such as ferric sulfate can also be used. The resulting product is a dispersion of the deuterated electrically conductive polymer doped with the non-fluorinated polymeric acid in $D_2O$.

In some embodiments, the doped electrically conductive polymer is selected from the group consisting of poly($D_6$-EDOT) doped with $D_8$-PSSA, poly($D_5$-Py) doped with $D_8$-PSSA, and $D_7$-Pani doped with $D_{13}$-PAAMPSA. These electrically conductive polymers are abbreviated as poly($D_6$-EDOT)/$D_8$-PSSA, poly($D_5$-Py)/$D_8$-PSSA, and $D_7$-Pani/$D_{13}$-PAAMPSA.

In the following discussion, the deuterated electrically conductive polymer and HFAP will be referred to in the singular. However, it is understood that more than one of either or both of these may be used.

The electrically conductive composition is prepared by first forming the deuterated doped electrically conductive polymer and then adding the HFAP and optional additives in any order. The ratio of acid equivalent of HFAP to acid equivalent of non-fluorinated doping acid is at least 0.1, and no greater than 4; in some embodiments, no greater than 2.

The deuterated doped electrically conductive polymer is generally formed by oxidative polymerization of a deuterated precursor monomer in the presence of the non-fluorinated polymeric acid in a deuterated liquid medium. The deuterated liquid medium is generally $D_2O$ or a mixture of $D_2O$ and perdeuterated organic solvent. Many of these materials are commercially available.

The HFAP can be first dissolved or dispersed in the deuterated liquid medium. This can then be added to a dispersion of the deuterated electrically conductive polymer in a deuterated liquid medium.

The optional additive, when present, can be added at any point. The additive can be added as a solution or dispersion in a deuterated liquid medium, or it can be added directly as a solid.

Alternatively, the non-deuterated analog of the doped electrically conductive polymer can be formed first, followed by deuteration of the material. In some embodiments, a partially-deuterated material is treated to increase the level of deuteration. Methods of deuteration are well known. Deuteration can generally be accomplished by treating the non-deuterated compound with deuterated solvent, such as d6-benzene, in the presence of a Lewis acid H/D exchange catalyst, such as aluminum trichloride or ethyl aluminum chloride, or acids such as CF$_3$COOD, DCI, etc. Some examples of deuteration methods can be found in a) "Efficient H/D Exchange Reactions of Alkyl-Substituted Benzene Derivatives by Means of the Pd/C—H2-D$_2$O System" Hiroyoshi Esaki, Fumiyo Aoki, Miho Umemura, Masatsugu Kato, Tomohiro Maegawa, Yasunari Monguchi, and Hironao Sajiki Chem. Eur. J. 2007, 13, 4052-4063. b) "Aromatic H/D Exchange Reaction Catalyzed by Groups 5 and 6 Metal Chlorides" GUO, Qiao-Xia, SHEN, Bao-Jian; GUO, Hai-Qing TAKAHASHI, Tamotsu *Chinese Journal of Chemistry*, 2005, 23, 341-344; c) "A novel deuterium effect on dual charge-transfer and ligand-field emission of the cis-dichlorobis(2,2'-bipyridine)iridium(III) ion" Richard J. Watts, Shlomo Efrima, and Horia Metiu *J. Am. Chem. Soc.*, 1979, 101 (10), 2742-2743; d) "Efficient H-D Exchange of Aromatic Compounds in Near-Critical D$_2$O Catalysed by a Polymer-Supported Sulphonic Acid" Carmen Boix and Martyn Poliakoff Tetrahedron Letters 40 (1999) 4433-4436; e) U.S. Pat. No. 3,849,458; f) "Efficient C—H/C-D Exchange Reaction on the Alkyl Side Chain of Aromatic Compounds Using Heterogeneous Pd/C in D2O" Hironao Sajiki, Fumiyo Aoki, Hiroyoshi Esaki, Tomohiro Maegawa, and Kosaku Hirota *Org. Lett.*, 2004, 6 (9), 1485-1487.

After deuteration of the electrically conductive polymer, the HFAP and optional additives are added as described above.

In some embodiments, the pH is increased either prior to or after the addition of the optional additive. The pH can be adjusted by treatment with deuterated cation exchange resins and/or base resins. In some embodiments, the pH is adjusted by the addition of a D$_2$O base solution. Cations for the base can be, but are not limited to, alkali metal, alkaline earth metal, perdeutero-ammonium, and perdeutero-alkylammonium. In some embodiments, alkali metal is preferred over alkaline earth metal cations.

Films can be made from the compositions described above using any liquid deposition technique, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing. The films thus formed are continuous, smooth and relatively transparent.

b. Deuterated Electrically Conductive Polymer Doped with HFAP

In some embodiments, the deuterated electrically conductive polymer doped with HFAP is formed by oxidative polymerization of the deuterated precursor monomer in the presence of the HFAP in a deuterated liquid medium. In some embodiments, the deuterated liquid medium is D$_2$O. The polymerization of the non-deuterated analog material has been described in published U.S. patent applications 2004/0102577, 2004/0127637, and 2005/0205860. The resulting product is a liquid dispersion of the deuterated electrically conductive polymer doped with HFAP.

In some embodiments, the composition is selected from the group consisting of poly(D$_4$-EDOT) and poly(D$_6$-EDOT) doped with perfluorinated deutero-acid polymer, poly(D$_5$-Py) doped with a perfluorinated deutero-acid polymer, and D$_7$-Pani doped with a perfluorinated deutero-acid polymer. In some embodiments, the perfluorinated deutero-acid polymer is a copolymer of TFE (tetrafluoroethylene) and PSEPVE (perfluoro-3,6-dioxa-4-methyl-7-octenesulfonic acid in which the acid proton has been exchanged for a deuteron. This material is abbreviated as "D-poly(TFE-PSEPVE)".

Alternatively, the non-deuterated analog of the doped electrically conductive polymer can be formed first, followed by deuteration of the material. In some embodiments, a partially-deuterated material is treated to increase the level of deuteration. Methods of deuteration are well known, as described above.

In some embodiments, the pH of the dispersion is increased, as discussed above. The dispersions of doped conductive polymer remain stable from the as-formed pH of about 2, to neutral pH.

In some embodiments, the dispersion of the doped conductive polymer is blended with other materials that are soluble or dispersible in the deuterated liquid medium. The additives are as discussed above.

5. Electronic Devices

Organic electronic devices that may benefit from having one or more layers comprising the deuterated materials described herein include, but are not limited to, (1) devices that convert electrical energy into radiation (e.g., a light-emitting diode, light-emitting diode display, light-emitting luminaire, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a thin film transistor or diode). The compounds of the invention often can be useful in applications such as oxygen sensitive indicators and as luminescent indicators in bioassays.

In one embodiment, an organic electronic device comprises at least one layer comprising (a) at least one deuterated electrically conductive polymer and (b) at least one highly-fluorinated acid polymer.

a. First Exemplary Device

A particularly useful type of transistor, the thin-film transistor ("TFT"), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, 2$^{nd}$ edition, John Wiley and Sons, page 492). These components can be assembled in a variety of configurations. An organic thin-film transistor (OTFT) is characterized by having an organic semiconductor layer. Organic semiconductor layer materials such as anthracene, regioregular polythiophenes, are well known in the art. The deuterated electrically conductive polymer compositions having electrical conductivity greater than 10 S/cm are particularly useful as electrodes of organic thin-film transistor ("OTFT").

In one embodiment, an OTFT comprises:
a substrate
an insulating layer;
a gate electrode;
a source electrode;
a drain electrode; and
an organic semiconductor layer;
wherein at least one electrode comprises a deuterated electrically conductive polymer, and wherein the insulating layer, the gate electrode, the semiconductor layer, the source electrode and the drain electrode can be arranged in any sequence provided that the gate electrode and the semiconductor layer both contact the insulating layer, the source electrode and the drain electrode both contact the semiconductor layer and the electrodes are not in contact with each other.

In FIG. 1A, there is schematically illustrated an organic field effect transistor (OTFT) showing the relative positions of the active layers of such a device in "bottom contact mode." (In "bottom contact mode" of an OTFT, the drain and source electrodes are deposited onto the gate dielectric layer prior to depositing the active organic semiconductor layer onto the source and drain electrodes and any remaining exposed gate dielectric layer.) A substrate 112 is in contact with a gate electrode 102 and an insulating layer 104 on top of which the source electrode 106 and drain electrode 108 are deposited. Over and between the source and drain electrodes are an organic semiconductor layer 110 comprising a compound of Formula 2.

Figure 1B:
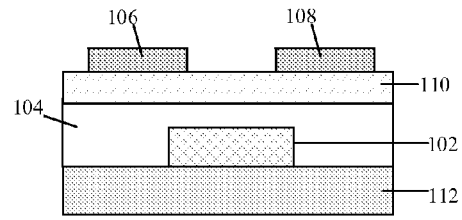
FIG. 1B includes a schematic diagram of an OTFT showing the relative positions of the active layers of such a device in top contact mode.

FIG. 1B is a schematic diagram of an OTFT showing the relative positions of the active layers of such a device in top contact mode. (In "top contact mode," the drain and source electrodes of an OTFT are deposited on top of the active organic semiconductor layer.)

Figure 1C:
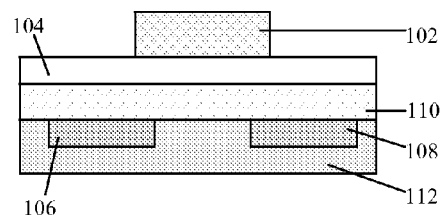
FIG. 1C includes a schematic diagram of an organic field effect transistor (OTFT) showing the relative positions of the active layers of such a device in bottom contact mode with the gate at the top.

FIG. 1C is a schematic diagram of OTFT showing the relative positions of the active layers of such a device in bottom contact mode with the gate at the top.

Figure 1D:
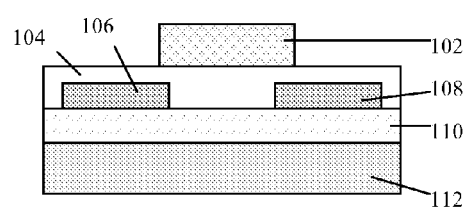
FIG. 1D includes a schematic diagram of an organic field effect transistor (OTFT) showing the relative positions of the active layers of such a device in bottom contact mode with the gate at the top.

FIG. 1D is a schematic diagram of an OTFT showing the relative positions of the active layers of such a device in top contact mode with the gate at the top.

The substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), and/or coated metallic foils. The thickness of the substrate can be from about 10 micrometers to over 10 millimeters; for example, from about 50 to about 100 micrometers for a flexible plastic substrate; and from about 1 to about 10 millimeters for a rigid substrate such as glass or silicon. Typically, a substrate supports the OTFT during manufacturing, testing, and/or use. Optionally, the substrate can provide an electrical function such as bus line connection to the source, drain, and electrodes and the circuits for the OTFT.

The gate electrode can be a thin metal film, a conducting polymer film, a conducting film made from conducting ink or paste or the substrate itself, for example heavily doped silicon. Examples of suitable gate electrode materials include aluminum, gold, chromium, indium tin oxide, conducting polymers, conducting ink/paste comprised of carbon black/graphite or colloidal silver dispersion in polymer binders. In some OTFTs, the same material can provide the gate electrode function and also provide the support function of the substrate. For example, doped silicon can function as the gate electrode and support the OTFT.

The gate electrode can be prepared by vacuum evaporation, sputtering of metals or conductive metal oxides, coating from conducting polymer solutions or conducting inks by spin coating, casting or printing. The thickness of the gate electrode can be, for example, from about 10 to about 200 nanometers for metal films and from about 1 to about 10 micrometers for polymer conductors.

In some embodiments, the gate electrode comprises a deuterated electrically conductive polymer. In some embodiments, the gate electrode comprises a deuterated electrically conductive polymer doped with a highly fluorinated acid polymer. In some embodiments, the gate electrode comprises (a) a deuterated electrically conductive polymer doped with a non-fluorinated polymeric acid and (b) a highly fluorinated acid polymer. In some embodiments, the electrode further comprises conductive particles selected from the group consisting of metal nanoparticles and carbon nanotubes.

The source and drain electrodes can be fabricated from materials that provide a low resistance ohmic contact to the semiconductor layer, such that the resistance of the contact between the semiconductor layer and the source and drain electrodes is less than the resistance of the semiconductor layer. Channel resistance is the conductivity of the semiconductor layer. Typically, the resistance should be less than the channel resistance. Typical materials suitable for use as source and drain electrodes include aluminum, barium, calcium, chromium, gold, silver, nickel, palladium, platinum, titanium, and alloys thereof; carbon nanotubes; conducting polymers; dispersions of carbon nanotubes in conducting polymers; dispersions of a metal in a conducting polymer; and multilayers thereof. Some of these materials are appropriate for use with n-type semiconductor materials and others are appropriate for use with p-type semiconductor materials, as is known to those skilled in the art. Typical thicknesses of source and drain electrodes are about, for example, from about 40 nanometers to about 1 micrometer. In some embodiments, the thickness is about 100 to about 400 nanometers.

In some embodiments, the source and/or drain electrode comprises a deuterated electrically conductive polymer. In some embodiments, the source and/or drain electrode comprises a deuterated electrically conductive polymer doped with a highly fluorinated acid polymer. In some embodiments, the source and/or drain electrode comprises (a) a deuterated electrically conductive polymer doped with a non-fluorinated polymeric acid and (b) a highly fluorinated acid polymer. In some embodiments, the electrode further comprises conductive particles selected from the group consisting of metal nanoparticles and carbon nanotubes.

The insulating layer comprises an inorganic material film or an organic polymer film. Illustrative examples of inorganic materials suitable as the insulating layer include aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of the aforesaid materials can be used for the insulating layer. Illustrative examples of organic polymers for the insulating layer include polyesters, polycarbonates, poly(vinyl phenol), polyimides, polystyrene, poly(methacrylate)s, poly(acrylate)s, epoxy resins and blends and multilayers thereof. The thickness of the insulating layer is, for example from about 10 nanometers to about 500 nanometers, depending on the dielectric constant of the dielectric material used. For example, the thickness of the insulating layer can be from about 100 nanometers to about 500 nanometers. The insulating layer can have a conductivity that is, for example, less than about $10^{-12}$ S/cm (where S=Siemens=1/ohm).

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The gate electrode, the source electrode, and the drain electrode can be provided using known methods such as physical vapor deposition (for example, thermal evaporation or sputtering) or ink jet printing. The patterning of the electrodes can be accomplished by known methods such as shadow masking, additive photolithography, subtractive photolithography, printing, microcontact printing, and pattern coating.

For the bottom contact mode OTFT (FIG. 1A), electrodes 106 and 108, which form channels for source and drain respectively, can be created on the silicon dioxide layer using a photolithographic process. A semiconductor layer 110 is then deposited over the surface of electrodes 106 and 108 and layer 104.

In some embodiments, semiconductor layer 110 comprises one or more organic semiconductor compounds. Organic semiconductors are typically based on: acenes, such as tetracene, pentacene and their derivatives; thiophenes, such as regioregular oligothiophenes and regioregular polythiophenes; fused-ring thiophene-aromatics and thiophene-vinylene/arylene derivatives.

The semiconductor layer 110 can be deposited by various techniques known in the art. These techniques include thermal evaporation, chemical vapor deposition, thermal transfer, ink-jet printing and screen-printing. Dispersion thin film coating techniques for deposition include spin coating, doctor blade coating, drop casting and other known techniques.

For top contact mode OTFT (FIG. 1B), layer 110 is deposited on layer 104 before the fabrication of electrodes 106 and 108.

b. Second Exemplary Device

The present invention also relates to an electronic device comprising at least one electroactive layer positioned between two electrical contact layers, wherein the at least one electroactive layer of the device comprises a deuterated electrically conductive polymer. In some embodiments, the electroactive layer comprises a deuterated electrically conductive polymer doped with a highly fluorinated acid polymer. In some embodiments, the electroactive layer comprises (a) a deuterated electrically conductive polymer doped with a non-fluorinated polymeric acid and (b) a highly fluorinated acid polymer. In some embodiments, the electrode further comprises conductive particles selected from the group consisting of metal nanoparticles and carbon nanotubes.

Figure 2:
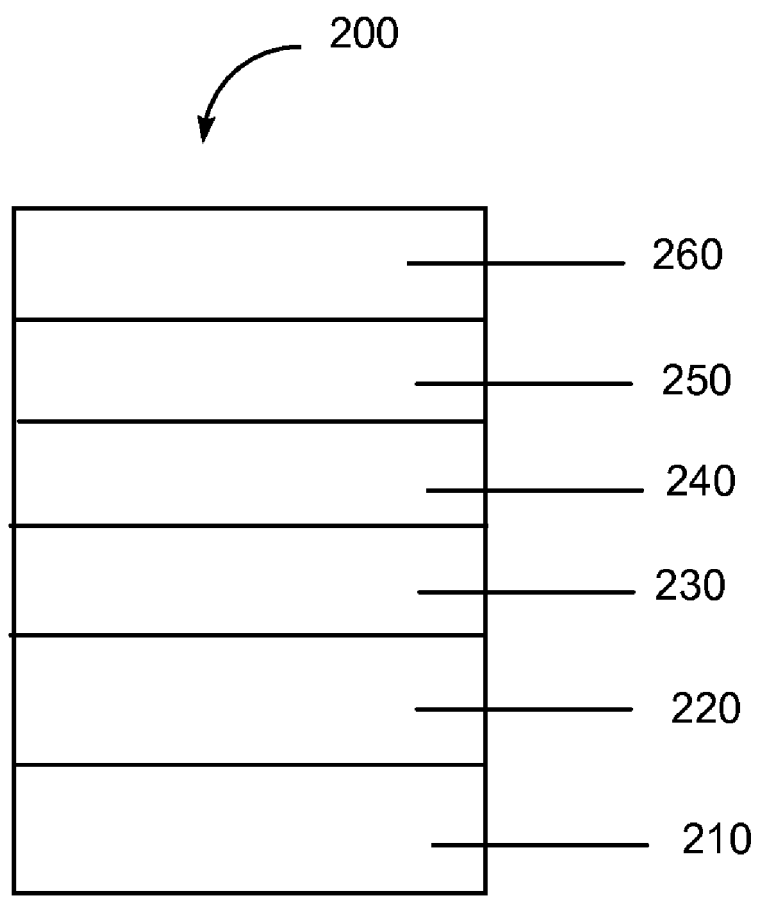
FIG. 2 includes a schematic diagram of another example of an organic electronic device.

Another example of an organic electronic device structure is shown in FIG. 2. The device 200 has a first electrical contact layer, an anode layer 210 and a second electrical contact layer, a cathode layer 260, and an electroactive layer 240 between them. Adjacent to the anode may be a hole injection layer 220. Adjacent to the hole injection layer may be a hole transport layer 230, comprising hole transport material. Adjacent to the cathode may be an electron transport layer 250, comprising an electron transport material. Devices may use one or more additional hole injection or hole transport layers (not shown) next to the anode 210 and/or one or more additional electron injection or electron transport layers (not shown) next to the cathode 260.

Layers 220 through 250 are individually and collectively referred to as the active layers.

Figure 3:
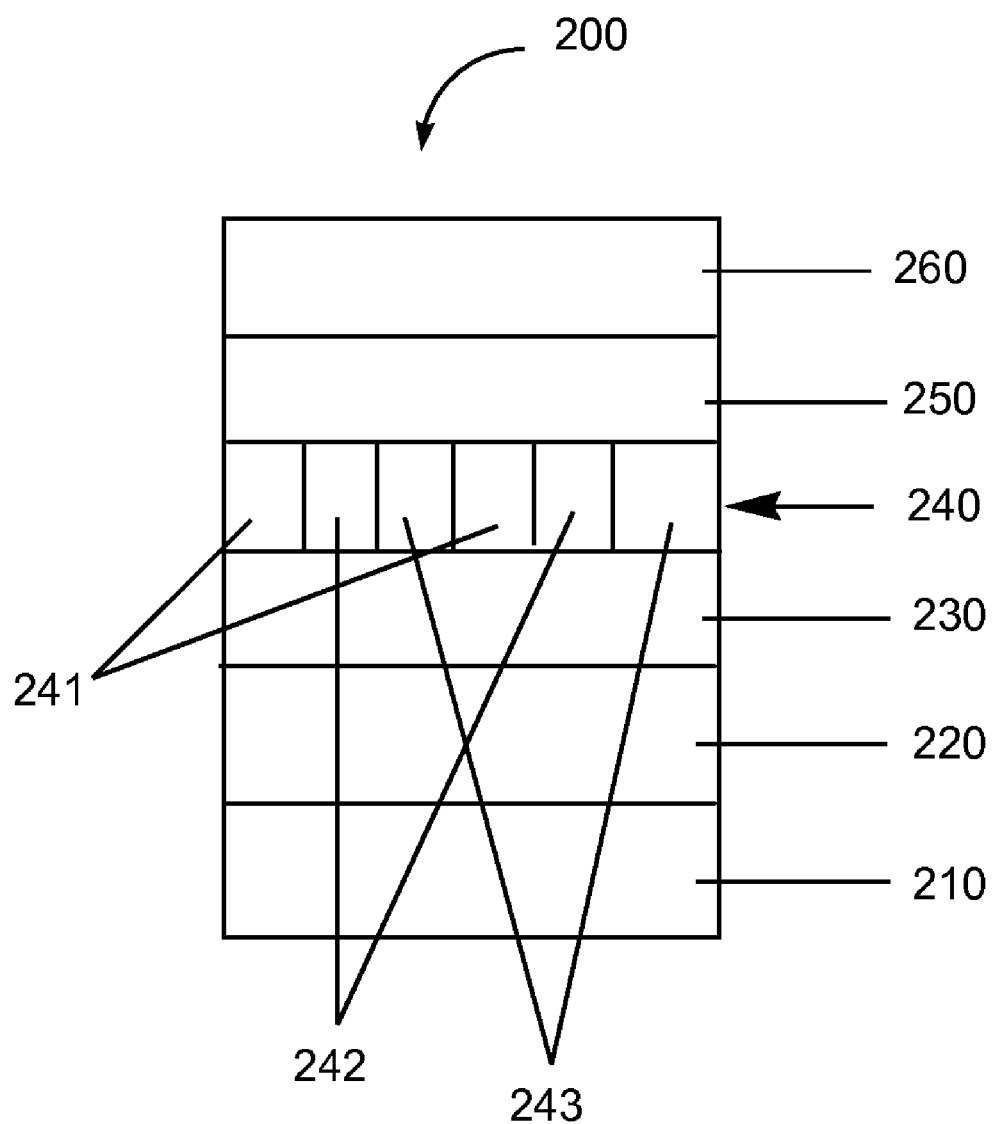
FIG. 3 includes a schematic diagram of another example of an organic electronic device.

In some embodiments, the electroactive layer 240 is pixellated, as shown in FIG. 3. Layer 240 is divided into pixel or subpixel units 241, 242, and 243 which are repeated over the layer. Each of the pixel or subpixel units represents a different color. In some embodiments, the subpixel units are for red, green, and blue. Although three subpixel units are shown in the figure, two or more than three may be used.

Depending upon the application of the device 200, the electroactive layer 240 can be a light-emitting layer that is activated by an applied voltage (such as in a light-emitting diode or light-emitting electrochemical cell), or a layer of material that responds to radiant energy and generates a signal with or without an applied bias voltage (such as in a photo-detector). Examples of photodetectors include photoconductive cells, photoresistors, photoswitches, phototransistors, and phototubes, and photovoltaic cells, as these terms are described in Markus, John, *Electronics and Nucleonics Dictionary,* 470 and 476 (McGraw-Hill, Inc. 1966). Devices with light-emitting layers may be used to form displays or for lighting applications, such as white light luminaires.

In some embodiments, the hole injection layer 220 comprises a deuterated electrically conductive polymer. In some embodiments, the hole injection layer 220 comprises (a) at least one deuterated electrically conductive polymer doped with a non-fluorinated polymeric acid and (b) at least one highly-fluorinated acid polymer. In some embodiments, the hole injection layer 220 consists essentially of (a) at least one deuterated electrically conductive polymer doped with a non-fluorinated polymeric acid and (b) at least one highly-fluorinated acid polymer. In some embodiments, the hole injection layer 220 comprises at least one deuterated electrically conductive polymer doped with at least one highly-fluorinated acid polymer. In some embodiments, the hole injection layer 220 consists essentially of at least one deuterated electrically conductive polymer doped with at least one highly-fluorinated acid polymer.

Other layers in the device can be made of any materials which are known to be useful in such layers upon consideration of the function to be served by such layers.

The device may include a support or substrate (not shown) that can be adjacent to the anode layer 210 or the cathode layer 260. Most frequently, the support is adjacent the anode layer 210. The support can be flexible or rigid, organic or inorganic. Examples of support materials include, but are not limited to, glass, ceramic, metal, and plastic films.

The anode layer 210 is an electrode that is more efficient for injecting holes compared to the cathode layer 260. Thus, the anode has a higher work-function than the cathode. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 210 is to be light transmitting, mixed oxides of Groups 12, 13 and 14 elements may be used. As used herein, the phrase "mixed oxide" refers to oxides having two or more different cations selected from the Group 2 elements or the Groups 12, 13, or 14 elements. Examples of suitable materials include, but are not limited to, indium-tin-oxide ("ITO"), indium-zinc-oxide ("IZO"), aluminum-tin-oxide ("ATO"), aluminum-zinc-oxide ("AZO"), zirconium-tin-oxide ("ZTO"), gold, silver, copper, and nickel.

In some embodiments, the mixed oxide layer is patterned. The pattern may vary as desired. The layer can be formed in a pattern by, for example, using a discontinuous deposition technique. Alternatively, the layer can be applied as an overall layer (also called blanket deposit) and subsequently patterned using, for example, a patterned resist layer and wet chemical or dry etching techniques. Other processes for patterning that are well known in the art can also be used.

In some embodiments, optional hole transport layer 230 is present, between hole injection layer 220 and electroactive layer 240. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenylamino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl) benzene (mCP); 1,1-bis[(di-4-tolylamino) phenyl] cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis (9H-carbazol-9-yl)cyclobutane (DCZB); N,N,N',N'-tetrakis (4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the electroactive layer 240 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional electron transport layer 250 can function both to facilitate electron injection/transport, and can also serve as a confinement layer to prevent quenching reactions at layer interfaces. More specifically, layer 250 may promote electron mobility and reduce the likelihood of a quenching reaction if layers 240 and 260 would otherwise be in direct contact. Examples of electron transport materials which can be used in the optional electron transport layer 250, include metal chelated oxinoid compounds, including metal quinolate derivatives such as tris(8-hydroxyquinolato)aluminum (AlQ), bis (2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1, 3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The cathode layer 260 is an electrode that is particularly efficient for injecting electrons or negative charge carriers. The cathode layer 260 can be any metal or nonmetal having a lower work function than the first electrical contact layer (in this case, the anode layer 210). The cathode 260, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage. This layer may be referred to as an electron injection layer.

The cathode layer 260 is usually formed by a chemical or physical vapor deposition process. In some embodiments, the cathode layer will be patterned, as discussed above in reference to the anode layer 210.

In some embodiments, an encapsulation layer (not shown) is deposited over the contact layer 260 to prevent entry of undesirable components, such as water and oxygen, into the device 200. Such components can have a deleterious effect on the organic layer 240. In one embodiment, the encapsulation layer is a barrier layer or film. In one embodiment, the encapsulation layer is a glass lid.

Though not depicted, it is understood that the device 200 may comprise additional layers. Other layers that are known in the art or otherwise may be used. In addition, any of the above-described layers may comprise two or more sub-layers or may form a laminar structure. Alternatively, some or all of anode layer 210, the hole injection layer 220, the hole transport layer 230, the electron transport layer 250, cathode layer 260, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 210, 500-5000 Å, in one embodiment 1000-2000 Å; hole injection layer 220, 50-3000 Å, in one embodiment 200-1000 Å; optional hole transport layer 230, 50-2000 Å, in one embodiment 200-1000 Å; electroactive layer 240, 10-2000 Å, in one embodiment 200-1000 Å; optional electron transport layer 250, 50-2000 Å, in one embodiment 200-1000 Å; cathode 260, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 200. Current therefore passes across the layers of the device 200. Electrons enter the organic polymer layer, releasing photons. In some OLEDs, called active matrix OLED displays, individual deposits of electroactive organic films may be independently excited by the passage of current, leading to individual pixels of light emission. In some OLEDs, called passive matrix OLED displays, deposits of electroactive organic films may be excited by rows and columns of electrical contact layers.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

Example 1

This example illustrates the deuteration of an HFAP to form a deutero-HFAP. It further illustrates the preparation of a dispersion of the deutero-HFAP in deuterium oxide ($D_2O$).

A copolymer of tetrafluoroethylene ("TFE") and perfluoro-3,6-dioxa-4-methyl-7-octenesulfonic acid ("PSEPVE") was deuterated and made into a colloidal dispersion in $D_2O$ in the following manner. Poly(TFE-PSEPVE) having one proton in sulfonic acid for every 987 gram (weight of the copolymer per one acidic site) was first made into water dispersion using a procedure similar to the procedure in U.S. Pat. No. 6,150,426, Example 1, Part 2, except that the temperature is approximately 270° C. The non-deuterated poly (TFE-PSEPVE) dispersion was converted to free-flowing solid flakes of poly(TFE-PSEPVE) on a tray having liquid depth no more than ⅝". The tray was then cooled to below 0° C. to freeze the water dispersion first. Once freezed, it was subjected to a partial vacuum pressure no higher than 1 mm Hg until most of water was removed. The partially dried solids were then taken up to about 30° C. under the vacuum pressure to completely remove the moisture without coalescing the polymer.

21 g of the solid flakes of non-deuterated poly(TFE-PSEPVE), pre-dried in a vacuum oven to remove water, were placed in a metal cylindrical tube pre-purged with nitrogen. 150 g $D_2O$ purchased from Cambridge Isotope Lab, Inc. was immediately added to the poly(TFE-PSEPVE) containing tube. The tube was capped and heated to about 270° C. in a pressure lab for a short period time before cooled down to R.T. to ensure conversion of the solid flakes to poly(TFE-PSEPVE) colloidal dispersion in $D_2O$. Moreover, the proton in poly(TFE-PSEPVE) in the overwhelming excess of deuterium has been exchanged with deuterium to complete deuteration of poly(TFE-PSEPVE). The deuterated poly(TFE-PSEPVE) ("D-poly(TFE-PSEPVE)") dispersion in $D_2O$ was further processed to remove larger particles. The D-poly (TFE-PSEPVE) weight % in the $D_2O$ dispersion was determined to be 11.34 wt. %, based on the total weight of the dispersion, by a gravimetric method.

Example 2

This example illustrates a direct process to form a deutero-HFAP and a dispersion of the deutero-HFAP in deuterium oxide ($D_2O$).

A copolymer of tetrafluoroethylene ("TFE") and perfluoro-3,6-dioxa-4-methyl-7-octenesulfonic acid ("PSEPVE") can be deuterated and made into a colloidal dispersion in $D_2O$ in the following manner. Poly(TFE-PSEPVE) resin having one proton in sulfonic acid for every 987 gram (weight of the copolymer per one acidic site) can be made into $D_2O$ dispersion using a procedure similar to the procedure in U.S. Pat. No. 6,150,426, Example 1, Part 2, except that the temperature is approximately 270° C. and $D_2O$ is used instead of water.

Example 3

This example illustrates the preparation of a deuterated electrically conductive polymer doped with a deuterated HFAP.

Deuterated pyrrole, ("$D_5$-Py") (Formula wt.: 72.12) was purchased from Aldrich Chemical Company (Milwaukee, Wis.). This brown-colored liquid was fractionally distilled under reduced pressure prior to use. The colorless distillate was characterized by $^{13}C$ NMR spectroscopy to confirm the structure.

Polymerization of $D_5$-Py in D-poly(TFE-PSEPVE)/$D_2O$ dispersion was carried out in the following manner. 70.2 g of the D-poly(TFE-PSEPVE)/$D_2O$ prepared in Example 1 was weighed in to a 500 mL resin kettle first before added additional 14 g $D_2O$. The amount of D-poly(TFE-PSEPVE)/$D_2O$ represents 8.14 mmol of acid. The kettle was capped with a glass lid having an overhead stirrer. While the D-poly(TFE-PSEPVE)/$D_2O$ being stirred, 0.135 g (0.26 mmol) ferric sulfate and 0.62 g (2.6 mmol) $Na_2S_2O_8$ pre-dissolved in 10 mL was added to the D-poly(TFE-PSEPVE)/$D_2O$, Shortly after, 0.175 g (2.43 mmol) $D_5$-Py pre-dissolved in 7 mL $D_2O$ was added to the mixture in one minute. Polymerization started immediately as soon as $D_5$-Py was added. The polymerization was allowed to proceed for 10 minutes. Addition of the ingredients and polymerization took place under nitrogen. At the end of 10 minutes, Dowex M-43 resin was added to the resin kettle and mixed for approximately 5 minutes. After vacuum filtered with 417 filter paper, Dowex M-31 $Na^+$ resin was added to the mixture and mixed for 5 minutes. The resulting material was vacuum filtered once again using 417 filter paper. The $D_2O$ dispersion of deuterated polypyrrole doped with D-poly(TFE-PSEPVE) ("poly($D_5$-Py)/D-poly (TFE-PSEPVE)") was treated with ion-exchanged resin again to further purify the dispersion in which it only contained 1.79 ppm of sulfate, and 0.79 ppm of chloride. Solid % of the dispersion was determined to be 4.3% and pH was determined to be 5.2. Electrical conductivity of cast film baked at 275° C. in a dry box for 30 minutes was measured to be $\sim 1\times10^{-6}$ S/cm at room temperature.

Example 4

This example demonstrates the fabrication and performance of a device using poly($D_5$-Py)/D-poly(TFE-PSEPVE) as the hole injection layer.

The device had the following structure on a glass substrate:

anode=Indium Tin Oxide (ITO): 50 nm hole injection layer=poly($D_5$-Py)/D-poly(TFE-PSEPVE) (45 nm)

hole transport layer=a non-crosslinked arylamine polymer (20 nm)

electroactive layer=13:1 host:dopant (40 nm). The host was a diarylanthracene derivative that is 88% deuterated. The dopant is an electroluminescent bis(diarylamino)chrysene derivative.

electron transport layer=a metal quinolate derivative (10 nm)

cathode=CsF/Al (1.0/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, the $D_2O$ dispersion of poly($D_5$-Py)/D-poly(TFE-PSEPVE) from Example 3 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. The electron transport layer was deposited by thermal evaporation, followed by a layer of CsF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current needed to run the device. The unit is a cd/A. The power efficiency is the current efficiency multiplied by pi, divided by the operating voltage. The unit is lm/W. Four devices were made in the same way. The device results are given in Table 1.

TABLE 1

Device Performance

| Ex. | CIE (x, y) | Voltage (V) | C.E. (cd/A) | E.Q.E. (%) | P.E. (lm/W) | Lifetest current density (mA/cm2) | Lifetest Luminance (nits) | Raw T50 (h) | Projected Lifetime T50 @1000 nits |
|---|---|---|---|---|---|---|---|---|---|
| 4-1 | 0.138, 0.116 | 4.5 | 4.9 | 5.0 | 3.5 | 134 | 5851 | 636 | 12816 |
| 4-2 | 0.138, 0.116 | 4.6 | 5.0 | 5.0 | 3.4 | 123 | 5267 | 701 | 11813 |
| 4-3 | 0.137, 0.119 | 4.4 | 5.5 | 5.5 | 3.9 | 132 | 6120 | 600 | 13051 |
| 4-4 | 0.136, 0.120 | 4.4 | 5.4 | 5.4 | 3.9 | 125 | 5996 | 795 | 16701 |

* All data @ 1000 nits,
CE = current efficiency;
CIEx and CIEy are the x and y color coordinates according to the C.I.E. chromaticity scale (Commission Internationale de L'Eclairage, 1931).
RawT50 is the time in hours for a device to reach one-half the initial luminance at the lifetest luminance given.
Projected T50 is the projected lifetime at 1000 nits using an accelerator factor of 1.7.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A composition selected from the group consisting of:
   (1) a composition comprising a deuterated electrically conductive polymer doped with a highly-fluorinated acid polymer; and
   (2) a composition comprising
   (a) a deuterated electrically conductive polymer doped with a non-fluorinated polymeric acid; and
   (b) at least one highly-fluorinated acid polymer.

2. The composition of claim 1, wherein the electrically conductive polymer is selected from the group consisting of a deuterated polythiophene, a deuterated polyaniline, a deuterated polypyrrole, a deuterated polymeric fused polycyclic heteroaromatic, a deuterated poly(aminoindole), a copolymer thereof, and combinations thereof.

3. The composition of claim 2, wherein the electrically conductive polymer is selected from the group consisting of poly($D_6$-3,4-ethylenedioxythiophene), poly($D_5$-pyrrole), poly($D_7$-aniline), poly(perdeutero-4-aminoindole), poly(perdeutero-7-aminoindole), poly(perdeutero-thieno(2,3-b)thiophene), poly(perdeutero-thieno(3,2-b)thiophene), and poly(perdeutero-thieno(3,4-b)thiophene).

4. The composition of claim 1, wherein the highly-fluorinated acid polymer is at least 95% fluorinated.

5. The composition of claim 1, wherein the highly-fluorinated acid polymer is selected from a sulfonic acid and a sulfonimide.

6. The composition of claim 1, wherein the highly-fluorinated acid polymer is a perfluoroolefin having perfluoroether-sulfonic acid side chains.

7. The composition of claim 1, wherein the highly-fluorinated acid polymer is perfluorinated and is a deutero-acid.

8. The composition of claim 1, wherein the composition comprises a deuterated electrically conductive polymer doped with a highly-fluorinated acid polymer.

9. The composition of claim 8, wherein the composition is selected from the group consisting of poly($D_6$-EDOT) doped with perfluorinated deutero-acid polymer, poly($D_5$-Py) doped with a perfluorinated deutero-acid polymer, and $D_7$-Pani doped with a perfluorinated deutero-acid polymer.

10. The composition of claim 1, wherein the composition comprises a (a) deuterated electrically conductive polymer doped with a non-fluorinated polymeric acid; and (b) at least one highly-fluorinated acid polymer.

11. The composition of claim 10, wherein the deuterated electrically conductive polymer is selected from the group consisting of $D_6$-poly(3,4-ethylenedioxythiophene) doped with $D_8$-polystyrenesulfonic acid, $D_4$-polypyrrole doped with $D_8$-polystyrenesulfonic acid, and $D_7$-polyaniline doped with $D_{13}$-poly(2-acrylamido-2 methyl-1-propanesulfonic acid).

12. A composition comprising a deuterated liquid medium having dispersed therein (a) a deuterated conductive polymer doped with a non-fluorinated polymeric acid and (b) a highly-fluorinated acid polymer.

13. A composition comprising a deuterated liquid medium having dispersed therein a deuterated conductive polymer doped with a highly-fluorinated acid polymer.

14. An organic electronic device comprising at least one layer comprising a composition selected from the group consisting of;
   (1) a deuterated electrically conductive polymer doped with a highly-fluorinated acid polymer; and
   (2) (a) a deuterated electrically conductive polymer doped with a non-fluorinated polymeric acid; and (b) at least one highly-fluorinated acid polymer.

15. The device of claim 14 comprising:
   a substrate
   an insulating layer;
   a gate electrode;
   a source electrode;
   a drain electrode; and
   an organic semiconductor layer;
   wherein at least one electrode comprises a deuterated electrically conductive polymer, and wherein the insulating layer, the gate electrode, the semiconductor layer, the source electrode and the drain electrode can be arranged in any sequence provided that the gate electrode and the semiconductor layer both contact the insulating layer, the source electrode and the drain electrode both contact the semiconductor layer and the electrodes are not in contact with each other.

16. The device of claim 15, wherein the composition comprises a deuterated electrically conductive polymer doped with a highly-fluorinated acid polymer.

17. An electronic device comprising at least one electroactive layer positioned between two electrical contact layers, wherein the at least one electroactive layer of the device comprises a composition selected from the group consisting of;
   (1) a deuterated electrically conductive polymer doped with a highly-fluorinated acid polymer; and
   (2) (a) a deuterated electrically conductive polymer doped with a non-fluorinated polymeric acid; and
   (b) at least one highly-fluorinated acid polymer.

18. The device of claim 17, wherein the composition comprises a deuterated electrically conductive polymer doped with a highly-fluorinated acid polymer.

19. The device of claim 17, wherein the composition comprises a (a) deuterated electrically conductive polymer doped with a non-fluorinated polymeric acid; and (b) at least one-highly-fluorinated acid polymer.

* * * * *